United States Patent
Shin et al.

(10) Patent No.: US 10,910,583 B2
(45) Date of Patent: Feb. 2, 2021

(54) ORGANIC LIGHT-EMITTING DIODE AND ORGANIC LIGHT-EMITTING DISPLAY DEVICE INCLUDING THE SAME

(71) Applicant: SAMSUNG DISPLAY CO., LTD., Yongin-si (KR)

(72) Inventors: Hyuneok Shin, Yongin-si (KR); Hongsick Park, Yongin-si (KR); Gyungmin Baek, Yongin-si (KR); Juhyun Lee, Yongin-si (KR); Sangwon Shin, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/387,899

(22) Filed: Apr. 18, 2019

(65) Prior Publication Data

US 2019/0334108 A1  Oct. 31, 2019

(30) Foreign Application Priority Data

Apr. 26, 2018  (KR) ........................ 10-2018-0048474

(51) Int. Cl.
*H01L 51/50* (2006.01)
*H01L 51/52* (2006.01)
(Continued)

(52) U.S. Cl.
CPC ...... *H01L 51/5092* (2013.01); *H01L 51/5004* (2013.01); *H01L 51/5012* (2013.01);
(Continued)

(58) Field of Classification Search
CPC ............. H01L 51/5092; H01L 51/5072; H01L 51/5206; H01L 51/5056; H01L 51/5004; H01L 51/5012; H01L 2251/552; H01L 2251/308; H01L 2251/558; H01L 51/0052; H01L 27/3246
See application file for complete search history.

(56) References Cited

U.S. PATENT DOCUMENTS 7,126,267 B2   10/2006   Liao et al.
7,928,463 B2   4/2011   Xuan
(Continued)

FOREIGN PATENT DOCUMENTS

JP   2009-044103   2/2009
KR   10-2012-0109352   10/2012
(Continued)

*Primary Examiner* — Patricia D Reddington
(74) *Attorney, Agent, or Firm* — Kile Park Reed & Houtteman PLLC

(57) ABSTRACT

An organic light-emitting diode includes a first electrode and a second electrode that face each other, an organic emission layer between the first electrode and the second electrode, and an inorganic hole injection layer between the first electrode and the organic emission layer. The inorganic hole injection layer includes oxide of a form A-B-O, including an element A and an element B. The element A is one of molybdenum (Mo) and tungsten (W). The element B is one of vanadium (V), niobium (Nb), and tantalum (Ta). An atom content (x) of the element B is greater than 0 and no more than 15 at % ($0 < x \leq 15$ at %) based on a total atom content of the inorganic hole injection layer.

19 Claims, 9 Drawing Sheets

(51) Int. Cl.
 _H01L 51/00_ (2006.01)
 _H01L 27/32_ (2006.01)
(52) U.S. Cl.
 CPC ...... _H01L 51/5056_ (2013.01); _H01L 51/5072_ (2013.01); _H01L 51/5206_ (2013.01); _H01L 27/3246_ (2013.01); _H01L 51/0052_ (2013.01); _H01L 2251/308_ (2013.01); _H01L 2251/552_ (2013.01); _H01L 2251/558_ (2013.01)

(56) References Cited

U.S. PATENT DOCUMENTS

| | | |
|---|---|---|
| 10,121,972 B2 | 11/2018 | Ogita et al. |
| 2010/0252857 A1* | 10/2010 | Nakatani ............ H01L 51/0029 257/100 |
| 2011/0068327 A1* | 3/2011 | Morishima ......... H01L 51/5052 257/40 |
| 2011/0140089 A1* | 6/2011 | Terao ................. H01L 51/5088 257/40 |
| 2012/0187389 A1* | 7/2012 | Shoda ................ H01L 27/3283 257/40 |
| 2017/0033301 A1 | 2/2017 | Han et al. |
| 2017/0033306 A1* | 2/2017 | Song .................. H01L 51/0052 |

FOREIGN PATENT DOCUMENTS

| | | |
|---|---|---|
| KR | 10-1200860 | 11/2012 |
| KR | 10-2017-0015780 | 2/2017 |

\* cited by examiner

ORGANIC LIGHT-EMITTING DIODE AND ORGANIC LIGHT-EMITTING DISPLAY DEVICE INCLUDING THE SAME

CROSS-REFERENCE TO RELATED APPLICATION

Korean Patent Application No. 10-2018-0048474, filed on Apr. 26, 2018, in the Korean Intellectual Property Office, and entitled: "Organic Light-Emitting Diode and Organic Light-Emitting Display Device Including the Same," is incorporated by reference herein in its entirety.

BACKGROUND

1. Field

Embodiments relate to organic light-emitting diodes and organic light-emitting display devices including the same.

2. Description of the Related Art

Organic light-emitting display devices include an organic light emitting diode (OLED) that includes a hole injection electrode, an electron injection electrode, and an organic emission layer between the hole injection electrode and the electron injection electrode. In addition, organic light-emitting display devices are self-emissive. In the organic emission layer, holes injected through the hole injection electrode and electrons injected through the electron injection electrode combine with each other to generate excitons that fall from an excited state to a ground state to generate light.

Organic light-emitting display devices do not require an additional light source and thus can be driven with a low voltage and manufactured to be light and thin. Also, the organic light-emitting display devices have favorable characteristics such as a wide viewing angle, a high contrast, and a fast response speed and thus have drawn attention as a next-generation display apparatus.

SUMMARY

Embodiments are directed an organic light-emitting diode including a first electrode and a second electrode that face each other, an organic emission layer between the first electrode and the second electrode, and an inorganic hole injection layer between the first electrode and the organic emission layer. The inorganic hole injection layer includes oxide of a form A-B-O, including an element A and an element B. The element A is one of molybdenum (Mo) and tungsten (W). The element B is one of vanadium (V), niobium (Nb), and tantalum (Ta). An atom content (x) of the element B is greater than 0 and no more than 15 at % ($0<x\leq15$ at %) based on a total atom content of the inorganic hole injection layer.

A work function of the inorganic hole injection layer may be greater than a work function of the first electrode.

The work function of the inorganic hole injection layer may be in a range of about 5.0 eV to about 5.8 eV.

A thickness of the inorganic hole injection layer may be in a range of about 10 Å to about 50 Å.

The inorganic hole injection layer and the first electrode may have a structure obtained by wet-etching the inorganic hole injection layer and the first electrode together by an etchant including at least one of phosphoric acid, nitric acid, and acetic acid.

A surface roughness of the inorganic hole injection layer may be in a range of about 0.3 nm to about 0.5 nm.

The organic light-emitting diode may further include an organic hole injection layer between the inorganic hole injection layer and the organic emission layer. A Fermi level that determines a work function of the inorganic hole injection layer may be higher than a highest occupied molecular orbital (HOMO) level of the organic hole injection layer.

The organic light-emitting diode may further include an electron transport layer and an electron injection layer stacked between the organic emission layer and the second electrode.

The organic light-emitting diode may further include a hole transport layer between the inorganic hole injection layer and the organic emission layer.

The first electrode may include indium tin oxide (ITO)/silver (Ag)/ITO. The inorganic hole injection layer may include molybdenum-tantalum-oxygen (Mo—Ta—O).

Embodiments are also directed to an organic light-emitting diode including a first electrode and a second electrode that face each other, an organic emission layer between the first electrode and the second electrode, and an inorganic hole injection layer between the first electrode and the organic emission layer. The inorganic hole injection layer may include an oxide of a form A-B-O including an element A and an element B. The element A may be one of molybdenum (Mo) and tungsten (W). The element B may be one of vanadium (V), niobium (Nb), and tantalum (Ta). A work function of the inorganic hole injection layer may be greater than a work function of the first electrode.

The work function of the first electrode may be about 4.0 eV to about 5.1 eV. The work function of the inorganic hole injection layer may be about 5.0 eV to about 5.8 eV.

The first electrode may include indium tin oxide (ITO)/silver (Ag)/ITO. The inorganic hole injection layer may include molybdenum-tantalum-oxygen (Mo—Ta—O). An atom content (x) of Ta is greater than 0 and no more than 15 at % ($0<x\leq15$ at %), based on a total atom content of the inorganic hole injection layer.

A thickness of the inorganic hole injection layer may be in a range of about 10 Å to about 50 Å.

Embodiments are also directed to an organic light-emitting display device including a plurality of pixels, each pixel including an organic light-emitting diode and at least one thin film transistor. The organic light-emitting diode includes a first electrode and a second electrode that face each other, an organic emission layer between the first electrode and the second electrode, and an inorganic hole injection layer between the first electrode and the organic emission layer. The inorganic hole injection layer includes an oxide of a form A-B-O including an element A and an element B. The element A is one of molybdenum (Mo) and tungsten (W), and the element B is one of vanadium (V), niobium (Nb), and tantalum (Ta). An atom content (x) of the element B is greater than 0 and no more than 15 at % ($0<x\leq15$ at %) based on a total atom content of the inorganic hole injection layer.

A work function of the inorganic hole injection layer may be greater than a work function of the first electrode.

The work function of the inorganic hole injection layer may be in a range of about 5.0 eV to about 5.8 eV.

A thickness of the inorganic hole injection layer may be in a range of about 10 Å to about 50 Å.

The inorganic hole injection layer and the first electrode may have a structure obtained by wet-etching the inorganic hole injection layer and the first electrode together by an etchant including at least one of phosphoric acid, nitric acid, and acetic acid.

The first electrode may include indium tin oxide (ITO)/silver (Ag)/ITO. The inorganic hole injection layer may include molybdenum-tantalum-oxygen (Mo—Ta—O). An atom content (x) of Ta may be greater than 0 and no more than 15 at % ($0<x\leq15$ at %), based on a total atom content of the inorganic hole injection layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
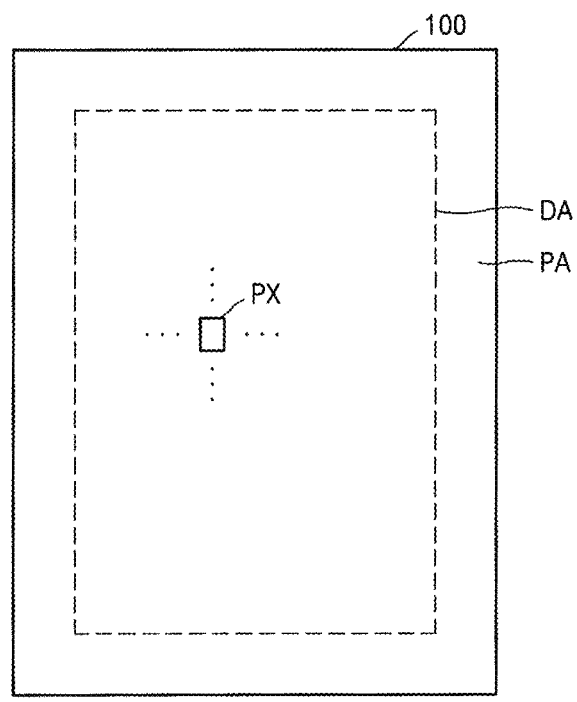
FIG. 1 illustrates a schematic plan view of an organic light-emitting display device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that although the terms "first", "second", etc. may be used herein to describe various components, these components should not be limited by these terms. These components are only used to distinguish one component from another.

As used herein, the singular forms "a", "an" and "the" are intended to include the plural forms as well, unless the context clearly indicates otherwise.

FIG. 1 illustrates a schematic plan view of an organic light-emitting display device according to an embodiment.

A plurality of pixels PX each including an organic light-emitting diode (OLED) may be arranged on a display area DA of a substrate 100. Each pixel PX may further include a plurality of thin film transistors (TFTs) for controlling the OLED, and a storage capacitor. The number of TFTs included in a single pixel may vary, for example from 1 to 7.

On a peripheral area PA of the substrate 100, various lines for transmitting electrical signals to be applied to the display area DA may be positioned. A TFT may be located on the peripheral area PA and may be a portion of a circuit unit for controlling an electrical signal applied to the display area DA.

Figure 2:
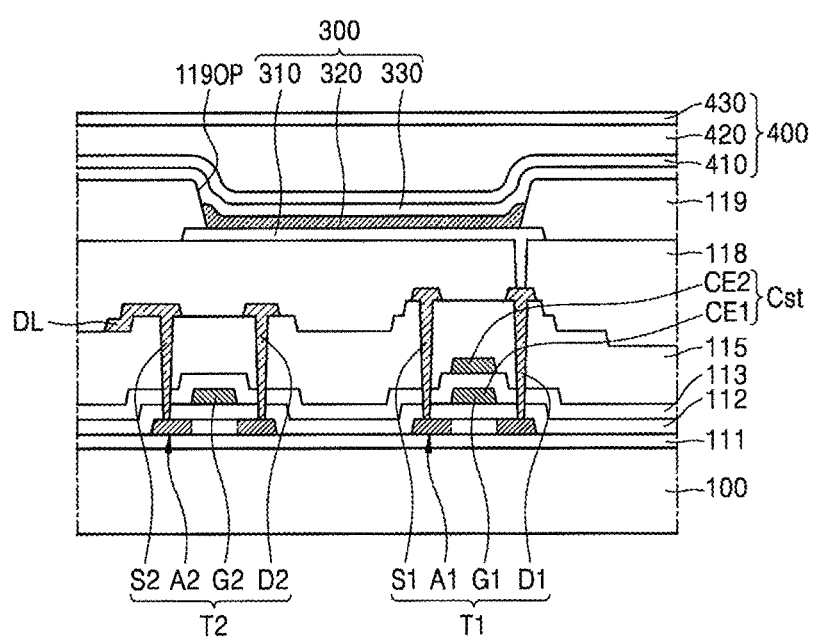
FIG. 2 illustrates a cross-sectional view of a portion of an organic light-emitting display device according to an embodiment.

FIG. 2 illustrates a cross-sectional view of a portion of an organic light-emitting display device according to an embodiment.

Referring to FIG. 2, the organic light-emitting display device may include the substrate 100, first and second TFTs T1 and T2 arranged on the substrate 100, and an OLED 300 electrically connected to the first and second TFTs T1 and T2. The organic light-emitting display device may further include various insulating layers, for example, a buffer layer 111, a first gate insulating layer 112, a second gate insulating layer 113, an interlayer insulating layer 115, a planarization layer 118, a pixel defining layer 119, and a storage capacitor Cst.

The substrate 100 may be formed of a suitable material such as, for example, glass, plastic, and metal. The substrate 100 may be a flexible substrate. For example, the substrate 100 may include a polymer resin, such as polyether sulfone (PES), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), or cellulose acetate propionate (CAP).

The buffer layer 111 may be positioned on the substrate 100. The buffer layer 111 may reduce or prevent infiltration of a foreign material, moisture, or ambient air from below the substrate 100 and may provide a flat surface on the substrate 100. The buffer layer 111 may include an inorganic material such as oxide or nitride, an organic material, or an organic and inorganic complex. The buffer layer 111 may be formed as a single layer or as multiple layers of an inorganic material and an organic material. A barrier layer may be interposed between the substrate 100 and the buffer layer 111 to help prevent the infiltration of an ambient air. According to some embodiments, the buffer layer 111 may include silicon oxide ($SiO_2$) or silicon nitride (SiNX).

The first TFT T1 and/or the second TFT T2 may be arranged on the buffer layer 111. The first TFT T1 may include a semiconductor layer A1, a gate electrode G1, a source electrode S1, and a drain electrode D1. The second TFT T2 may include a semiconductor layer A2, a gate electrode G2, a source electrode S2, and a drain electrode D2. The first TFT T1 may be connected to the OLED 300 and may function as a driving TFT that drives the OLED 300. The second TFT T2 may be connected to a data line DL and may function as a switching TFT. The number of TFTs may vary. For example, the number of TFTs may be from 1 to 7. For example, number of TFTs May be two, as illustrated in FIG. 2.

The semiconductor layers A1 and A2 may include amorphous silicon or polycrystalline silicon. According to an implementation, the semiconductor layers A1 and A2 may include oxide of at least one of indium (In), gallium (Ga), tin (Sn), zirconium (Zr), vanadium (V), hafnium (Hf), cadmium (Cd), germanium (Ge), chromium (Cr), titanium (Ti), and zinc (Zn). The semiconductor layers A1 and A2 may include a channel region, and a source region and a drain region doped with impurities.

The gate electrodes G1 and G2 may be arranged on the semiconductor layers A1 and A2 with the first gate insulating layer 112 interposed therebetween. The gate electrodes G1 and G2 may include, for example, molybdenum (Mo), aluminum (Al), copper (Cu), or titanium (Ti). The gate electrodes G1 and G2 may be a single layer or multiple layers. For example, each of the gate electrodes G1 and G2 may be a single layer of Mo.

The first gate insulating layer 112 may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like.

The second gate insulating layer 113 may cover the gate electrodes G1 and G2. The second gate insulating layer 113 may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like.

A first storage electrode CE1 of the storage capacitor Cst may overlap the first TFT T1. For example, the gate electrode G1 of the first TFT T1 may function as the first storage electrode CE1 of the storage capacitor Cst. In some implementations, the storage capacitor Cst may be spaced apart from the first and second TFTs T1 and T2 such that the storage capacitor Cst does not overlap the first TFT T1.

A second storage electrode CE2 of the storage capacitor Cst may overlap the first electrode CE1 with the second gate insulating layer 113 therebetween. In this case, the second gate insulating layer 113 may function as a dielectric layer of the storage capacitor Cst. The second storage electrode CE2 may include a conductive material including molybdenum (Mo), aluminum (Al), copper (Cu), and titanium (Ti) as the second storage electrode CE2 may be in a form of a multi-layer or single layer including the aforementioned materials. For example, the second storage electrode CE2 may be a single layer of Mo or a multi-layer of Mo/Al/Mo.

The interlayer insulating layer 115 may be formed on the entire surface of the substrate 110 such that the interlayer insulating layer 115 covers the second storage electrode CE2. The interlayer insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like.

The source electrodes S1 and S2 and the drain electrodes D1 and D2 may be arranged on the interlayer insulating layer 115. Each of the source electrodes S1 and S2 and the drain electrodes D1 and D2 may include a conductive material including Mo, Al, Cu, and Ti and may be a multi-layer or single layer including the aforementioned materials. For example, each of the source electrodes S1 and S2 and the drain electrodes D1 and D2 may be formed as a multi-layer of Ti/Al/Ti. Each of the source electrodes S1 and S2 and the drain electrodes D1 and D2 may extend through a respective contact hole in the interlayer insulating layer 115 to contact a respective source region or drain region of the first TFT T1 or the second TFT T2.

The planarization layer 118 may be positioned on the source electrodes S1 and S2 and the drain electrodes D1 and D2, and the OLED 300 may be positioned on the planarization layer 118. The OLED 300 may include a first electrode 310, an intermediate layer 320 including an organic emission layer, and a second electrode 330.

The planarization layer 118 may have a flat upper surface such that the first electrode 310 may be formed flat. The planarization layer 118 may be in a form of a single layer including an organic or inorganic material or in a form of a multi-layer formed by stacking single layers including an organic or inorganic material. The planarization layer 118 may include a commercial polymer such as benzocyclobutene (BCB), polyimide, hexamethyldisiloxane (HMDSO), polymethyl methacrylate (PMMA) or polystyrene (PS), a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, a blend thereof, or the like. The planarization layer 118 may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like. After the planarization layer 118 is formed, chemical and mechanical polishing may be performed to provide a flat upper surface.

An opening via which one of the source electrode S1 and the drain electrode D1 of the first TFT T1 is formed in the planarization layer 118. The first electrode 310 of the OLED 300 may contact the source electrode S1 or the drain electrode D1 via the opening and may be electrically connected to the first TFT T1.

The pixel defining layer 119 may be arranged on the first electrode 310. The pixel defining layer 119 may define pixels by including an opening 1190P corresponding to each sub-pixel, for example, an opening 1190P via which at least a center portion of the first electrode 310 is exposed. By increasing a distance between the edge of the first electrode 310 and the second electrode 330, the pixel defining layer 119 may prevent an arc or the like from occurring between an edge of the first electrode 310 and the second electrode 330. The pixel defining layer 119 may be formed of an organic material, for example, polyimide or hexamethyldisiloxane (HMDSO).

A spacer may be arranged on the pixel defining layer 119. The spacer may be included to prevent damage from occurring during a mask process in forming the intermediate layer 320 of the OLED 300. The spacer may be formed of an organic material, for example, polyimide or HMDSO. The spacer may be formed of the same material as that used to form the pixel defining layer 119 and may be formed simultaneously with the forming of the pixel defining layer 119. In this case, a halftone mask may be used.

Figure 3:
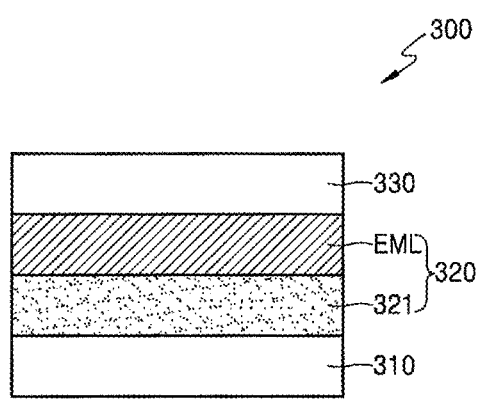
FIG. 3 illustrates a schematic cross-sectional view of a stacked structure of an organic light-emitting diode (OLED) according to an embodiment.

The intermediate layer 320 of the OLED 300 may include an organic emission layer EML of FIG. 3. The organic emission layer (EML) may include an organic material including a fluorescent or phosphorescent material that emits red, green, blue, or white light. The organic emission layer may include a low molecular organic material or a high molecular organic material, and one or more functional layers, such as a hole transport layer (HTL), an hole injection layer (HIL), an electron transport layer (ETL). An electron injection layer (EIL), may be further arranged below and above the organic emission layer. The intermediate layer 320 may be arranged to correspond to each of a plurality of first electrodes 310. In some implementations, the intermediate layer 320 may be formed as a single layer that extends over the plurality of first electrodes 310. In this way, various modifications may be made.

The second electrode 330 may be a transparent electrode or a reflective electrode. According to some embodiments, the second electrode 330 may be a transparent or semi-transparent electrode, and may be a metal thin film having a small work function. The metal thin film may include lithium (Li), calcium (Ca), lithium fluoride/calcium (LiF/Ca), lithium fluoride/aluminum (LiF/Al), aluminum (Al), silver (Ag), magnesium (Mg), or a compound thereof. A transparent conductive oxide (TCO) layer including TCO, such as indium tin oxide (ITO), indium zinc oxide (IZO), zinc oxide (ZnO), or indium oxide ($In_2O_3$), may be further disposed on the metal thin film. The second electrode 330 may extend over the display region DA and the peripheral region PA, and may be arranged on the intermediate layer 320 and the pixel defining layer 119. The second electrode 330 may be a common electrode included for a plurality of OLEDs 300, or may correspond to the plurality of first electrodes 310. A more detailed structure of the OLED 300 will be described below.

A thin film encapsulation layer 400 encapsulating the display area DA may be arranged on the OLED 300. The thin film encapsulation layer 400 may cover the display area DA and may help to protect the OLED 300 or the like from external moisture or oxygen. The thin film encapsulation layer 400 may include a first inorganic encapsulation layer 410, an organic encapsulation layer 420, and a second inorganic encapsulation layer 430.

The first inorganic encapsulation layer 410 may cover the second electrode 330. The first inorganic encapsulation layer 410 may include ceramic, metal oxide, metal nitride, metal carbide, metal oxynitride, indium nitride ($In_2O_3$), tin oxide ($SnO_2$), indium tin oxide (ITO), silicon oxide, silicon nitride, and/or silicon oxynitride. As desired, other layers, such as, a capping layer, may be interposed between the first inorganic encapsulation layer 410 and the second electrode 330. As shown in FIG. 2, when the first inorganic encapsulation layer 410 is formed along a structure below the first inorganic encapsulation layer 410, the upper surface thereof is not flat.

The organic encapsulation layer 420 may cover the first inorganic encapsulation layer 410. In contrast with the first inorganic encapsulation layer 410, the organic encapsulation layer 420 may have an approximately flat upper surface. For example, a portion of the organic encapsulation layer 420 corresponding to the display area DA may have an approximately flat upper surface. The organic encapsulation layer 420 may include at least one material from among acryl, methacrylic, polyester, polyethylene, polypropylene, polyethylene terephthalate (PET), polyethylene naphthalate, polycarbonate, polyimide, polyethylene sulfonate, polyoxymethylene, polyarylate, and hexamethyldisiloxane.

The second inorganic encapsulation layer 430 may cover the organic encapsulation layer 420. The second inorganic encapsulation layer 430 may include ceramic, metal oxide, metal nitride, metal carbide, metal oxynitride, indium nitride ($In_2O_3$), tin oxide ($SnO_2$), indium tin oxide (ITO), silicon oxide, silicon nitride, and/or silicon oxynitride. An edge of the second inorganic encapsulation layer 430 outside the display area DA may contact the first inorganic encapsulation layer 410 such that the organic encapsulation layer 420 is exposed to the outside.

As such, when the thin film encapsulation layer 400 includes the first inorganic encapsulation layer 410, the organic encapsulation layer 420, and the second inorganic encapsulation layer 430, even if the thin film encapsulation layer 400 were to crack due to this multi-layered structure, this crack might not be connected between the first inorganic encapsulation layer 410 and the organic encapsulation layer 420 or between the organic encapsulation layer 420 and the second inorganic encapsulation layer 430. Accordingly, formation of a path by which external moisture, oxygen, or the like could permeate into the display area DA may be prevented or minimized.

Various functional layers, such as a touch screen layer and a polarization film, may be further arranged on the thin film encapsulation layer 400. A capping layer for increasing light efficiency may be further included between the second electrode 330 and the thin film encapsulation layer 400.

A more detailed structure of the OLED 300 will now be described with reference to FIG. 3.

FIG. 3 illustrates a schematic cross-sectional view of a stacked structure of the OLED 300 according to an embodiment. Referring to FIG. 3, the OLED 300 may include the first electrode 310, the intermediate layer 320, and the second electrode 330 sequentially stacked one on another. The intermediate layer 320 may include an inorganic hole injection layer 321 and the organic emission layer EML.

The first electrode 310 may function as an anode electrode. A material having a high work-function may be selected such that holes are smoothly injected into the organic emission layer EML. The first electrodes 310 may have a work function of about 4.0 to about 5.1 eV. The first electrode 310 may be a transparent or semi-transparent electrode or a reflective electrode. When the first electrode 310 is a transparent electrode, ITO, IZO, $SnO_2$, ZnO, or $In_2O_3$ may be used. When the first electrode 310 is a reflective electrode, the first electrodes 310 may include a reflective layer formed of silver (Ag), magnesium (Mg), aluminum (Al), platinum (Pt), palladium (Pd), gold (Au), nickel (Ni), neodymium (Nd), iridium (Ir), chromium (Cr), or a compound thereof, and a transparent layer formed of ITO, IZO, ZnO, or $In_2O_3$. According to some embodiments, the first electrode 310 may have a structure including a single layer or multiple layers. For example, the first electrode 310 may have a two-layer structure of ITO/Ag or a three-layer structure of ITO/Ag/ITO. When an uppermost layer of the first electrode 310 is an ITO layer, a work function of the ITO layer may be 4.9 eV through 5.1 eV. The work function of the ITO layer may be controlled by plasma processing.

The intermediate layer 320 may include the inorganic hole injection layer 321 and the organic emission layer EML. The inorganic hole injection layer 321 may be arranged between the first electrode 310 and the organic emission layer EML. The inorganic hole injection layer 321 may include an inorganic materia, which may be a material having a higher work function than that of the material used to form the first electrode 310. Accordingly, holes may be easily injected from the first electrode 310 into the organic emission layer EML. When the first electrode 310 has a multi-layer structure, a work function of the inorganic hole injection layer 321 may have a higher work function than that of a material used to form the uppermost layer (layer in direct contact with the inorganic hole injection layer 321) of the first electrode 310. According to some embodiments, the work function of the inorganic hole injection layer 321 may be in the range of about 5.0 eV through about 5.8 eV.

The inorganic hole injection layer 321 according to the present embodiment may include a material that is favorable in terms of process and that has good optical characteristics, from among materials having higher work functions than that of the material used to form the first electrode 310.

In this regard, a material used to form the inorganic hole injection layer 321 according to the present embodiment may be an oxide having a form of A-B-O, including an element A and an element B. The element A may be selected from materials in Group 6, and the element B may be selected from materials in Group 5. For example, the element A may be one of molybdenum (Mo) and tungsten (W), and the element B may be one of vanadium (V), niobium (Nb), and tantalum (Ta). A content (x) of the element B may be greater than 0 and no more than 15 at % ($0<x\leq 15$ at %) based on a total atom content of the inorganic hole injection layer.

An oxide including only the element A, for example, Mo oxide and W oxide ($MoO_2$, $MoO_3$, $WO_2$, and $WO_3$), has a high work function but reacts with water ($H_2O$). Accordingly, if an oxide including only the element A were to be used to form the inorganic hole injection layer 321, erosion could occur during a process using water.

Therefore, in the present embodiment, the element B is introduced to prevent a reaction with water while maintaining a high work function. The element B may be one of vanadium (V), niobium (Nb), and tantalum (Ta). An atom content (x) of the element B in the oxide A-B-O may be greater than 0 and no more than 15 at % ($0<x\leq 15$ at %), based on the total atom content of the inorganic hole injection layer 321.

The element B is a material introduced to prevent the inorganic hole injection layer 321 from reacting with water. Thus the content x of the element B may be controlled to be greater than 0 and no more than 15 at % (atomic %) ($0<x\leq 15$ at %) so that the inorganic hole injection layer 321 may maintain a high work function.

The inorganic hole injection layer 321 including the A-B-O oxide may be wet-etched together with the first electrode 310 arranged therebelow. For example, the inorganic hole injection layer 321 may be etched by an etchant that etches metal and a conductive oxide. The simultaneous etching of the inorganic hole injection layer 321 and the first electrode 310 may promote simplification of a process. According to some embodiments, the etchant may contain phosphoric acid, nitric acid, and/or acetic acid.

The inorganic hole injection layer 321 according to the present embodiment may have a highly flat surface. For example, a surface roughness (RMS) of the inorganic hole injection layer 321 may be about 0.3 to about 0.5 nm. This surface flatness may help the organic emission layer EML to be evenly formed on the inorganic hole injection layer 321.

A thickness of the inorganic hole injection layer 321 may be about 10 Å to about 50 Å. When the inorganic hole injection layer 321 has a thickness of more than 10 Å, the inorganic hole injection layer 321 may be properly function as a hole injection layer. When the inorganic hole injection layer 321 has a thickness less than 50 Å, a degradation of optical efficiency may be avoided. The optical efficiency may be calculated by complexly considering an optical length between the first electrode 310 and the second electrode 330 and the reflectivity of the first electrode 310. Thus, when the thickness of the inorganic hole injection layer 321 is too large, penetration of light reflected by the first electrode 310 may be degraded, or light efficiency may be degraded due to a variation in the optical length.

The organic emission layer EML may include a low or high molecular weight material that enables fluorescent or phosphorescent emission. In the organic emission layer EML, holes and electrons injected into the first electrode 310 and the second electrode 330 recombine with each other to generate excitons that fall from an excited state to a ground state to generate light. At this time, emission wavelengths of green light, red light, and blue light may be determined according to a material used to form the organic emission layer EML.

According to some embodiments, the organic emission layer EML may include copper phthalocyanine (CuPc), N,N'-Di(naphthalene-1-yl)-N,N-diphenyl-benzidine (NPB), and tris-8-hydroxyquinoline aluminum (Alq3), a poly-phenylenevinylene (PPV)-based material, or a polyfluorene-based material. The organic emission layer EML may be formed via vacuum deposition, screen printing, inkjet printing, laser induced thermal imaging (LITI), or the like.

The second electrode 330 is arranged on the organic emission layer EML. The second electrode 330 may be a cathode, for example, an electron-injection electrode. A material having a low work function may be selected to facilitate electron injection. For example, a material having a work function of 2 eV through 5 eV may be used to form the second electrode 330. According to some embodiments, reflective, transreflective, or transmissive type properties may be obtained by forming the second electrode 330 as a thin film of lithium (Li), magnesium (Mg), aluminum (Al), silver (Ag), Al—Li, calcium (Ca), magnesium-indium (Mg—In). Mg—Ag, LiF/Al, or $LiO_2$/Al. In some implementations, the second electrode 330 may be in a form of a transmissive type electrode including ITO, IZO, ZnO, or $In_2O_3$ in order to obtain a front-emission device. In this way, various modifications may be made.

As described above, the OLED 300 according to the present embodiment may include the inorganic hole injection layer 321, which includes a material having a higher work function than that of the first electrode 310, which serves as an anode electrode. Accordingly, hole injection may be smoothened. Formation of the inorganic hole injection layer 321 may be favorable in terms of process and changes in terms of optical characteristics may be as small as possible. Accordingly, light efficiency and process efficiency may be increased.

Figure 4:
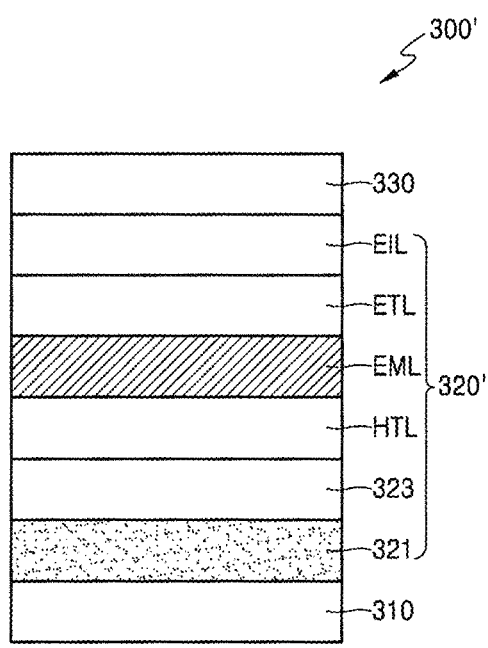
FIG. 4 illustrates a schematic cross-sectional view of a stacked structure of an OLED according to another embodiment.
Figure 5:
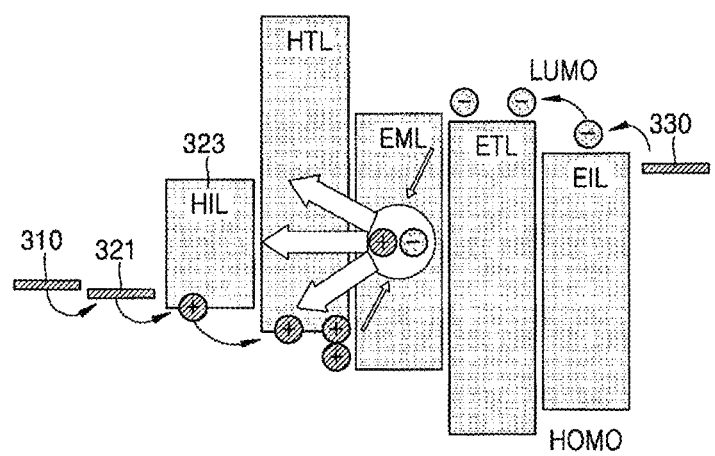
FIG. 5 illustrates an energy band diagram of each layer included in the OLED of FIG. 4.

FIG. 4 illustrates a schematic cross-sectional view of a stacked structure of an OLED 300' according to another embodiment, and FIG. 5 illustrates an energy band diagram of the OLED 300'. The same reference numerals in FIG. 3 and FIGS. 4 and 5 denote the same elements, and thus descriptions thereof are not repeated.

Referring to FIGS. 4 and 5, the OLED 300' may include the first electrode 310, an intermediate layer 320', and the second electrode 330 sequentially stacked one on another. The intermediate layer 320' may include the inorganic hole injection layer 321, an organic hole injection layer 323, a hole transport layer HTL, the organic emission layer EML, an electron transport layer ETL, and an electron injection layer EIL sequentially stacked one on another.

The inorganic hole injection layer 321 may include oxide in a form of A-B-O including an element A and an element B, wherein the element A is one of molybdenum (Mo) and tungsten (W), the element B is one of vanadium (V), niobium (Nb), and tantalum (Ta), and a content (x) of the element B is greater than 0 and no more than 15 at % ($0<x\leq 15$ at %), based on a total content of the inorganic hole injection layer 321.

The inorganic hole injection layer 321 may have a higher work function than that of the first electrode 310. According to some embodiments, the work function of the first electrode 310 may be about 4.0 eV to about 5.1 eV, and the work function of the inorganic hole injection layer 321 may be about 5.0 to about 5.8 eV. According to some embodiments, the first electrode 310 may be ITO/Ag/ITO or ITO/Ag, and the inorganic hole injection layer 321 may be Mo—Ta—O (where a content (x) of Ta is about 0<x≤15 at %), based on a total content of the inorganic hole injection layer 321.

A thickness of the inorganic hole injection layer 321 may be about 10 Å to about 50 Å. The inorganic hole injection layer 321 and the first electrode 310 may be wet-etched together by an etchant including at least one of phosphoric acid, nitric acid, and acetic acid. The surface roughness of the inorganic hole injection layer 321 may be about 0.3 nm to about 0.5 nm.

The organic hole injection layer 323, the hole transport layer HTL, the electron transport layer ETL, and the electron injection layer EIL may be omitted in some cases.

In the energy band diagram of FIG. 5, the bottom line is a highest energy level of a valence band and is thus referred to as a highest occupied molecular orbital (HOMO), and the top line is a lowest energy level of a conduction band and is thus referred to as a lowest unoccupied molecular orbital (LUMO). An energy difference between the HOMO and the LUMO is a band gap.

The organic hole injection layer 323, the hole transport layer HTL, the electron transport layer ETL, and/or the electron injection layer EIL may be layers introduced to lower an energy barrier between layers such that holes and/or electrons easily reach the organic emission layer EML.

The organic hole injection layer 323 may include a material capable of smoothly receiving holes from the first electrode 310 and the inorganic hole injection layer 321 at a low voltage, and an HOMO of the material of the organic hole injection layer 323 may be between a Fermi level that determines a work function of the material of the inorganic hole injection layer 321 and an HOMO of an organic material layer around the organic hole injection layer 323. For example, the HOMO of an organic hole injection material may be formed at a level that is lower than the Fermi level that determines the work function of the inorganic hole injection layer 321.

Examples of the organic hole injection layer 323 may include, for example, metal porphyrine-based, oligothiophene-based, and arylamine-based organic materials; hexanitrile hexaazatriphenylene-based and quinacridone-based organic materials; a perylene-based organic material; and anthraquinone-based, polyaniline-based, and polythiophene-based conductive copolymers.

Similarly, the hole transport layer HTL may include a material capable of smoothly receiving holes from the organic hole injection layer 323. Thus a HOMO of the material of the hole transport layer HTL may be lower than that of the material of the organic hole injection layer 323.

The electron injection layer EIL may include a material capable of smoothly receiving electrons from the second electrode 330 at a low voltage. A LUMO of the material of the electron injection layer EIL may be between a Fermi level that determines a work function of the material of the second electrode 330 and a LUMO of an organic material layer around the organic hole injection layer 323.

Similarly, the electron transport layer ETL may include a material capable of smoothly receiving electrons from the electron injection layer EIL. Thus a LUMO of the material of the electron transport layer ETL may be higher than that of the material of the electron injection layer EIL. According to some embodiments, the electron transport layer ETL may include PBP(4-phenylbenzophenone), t-Bu-PBD(2-(biphenyl-4yl)-5-(4-tert-butylphenyl)-1,3,4-oxadiazole), 3TPYMB(tris-[3-(3-pyridyl)mesityl]borane), or B3PYMPM(bis-4,6-(3,5-di-3-pyridylphenyl)-2-methylpyrimi-dine).

The OLED 300' according to the present embodiment includes not only the inorganic hole injection layer 321 but also various organic functional layers enabling holes and electrons to be easily transmitted to the organic emission layer EML. Accordingly lluminescence efficiency may be improved even more.

Figure 6:
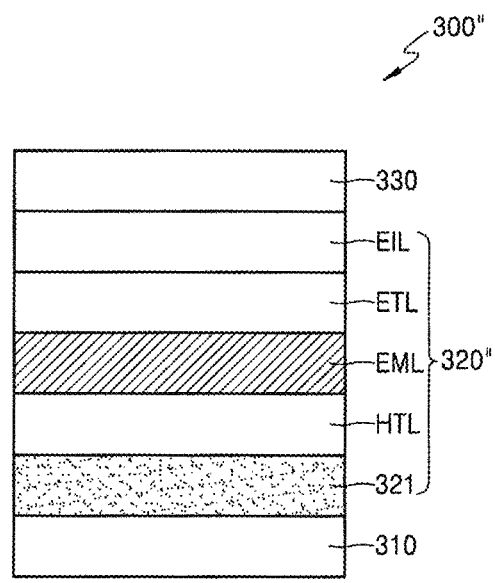
FIG. 6 illustrates a schematic cross-sectional view of a stacked structure of an OLED according to an embodiment.

FIG. 6 illustrates a schematic cross-sectional view of a stacked structure of an OLED 300" according to an embodiment. The same reference numerals in FIGS. 3 and 4 and FIG. 6 denote the same elements, and thus descriptions thereof are not repeated.

Referring to FIG. 6, the OLED 300" may include the first electrode 310, an intermediate layer 320", and the second electrode 330 sequentially stacked one on another. The intermediate layer 320" may include the inorganic hole injection layer 321, a hole transport layer HTL, the organic emission layer EML, an electron transport layer ETL, and an electron injection layer EIL sequentially stacked one on another.

The inorganic hole injection layer 321 may include an oxide having a form of A-B-O, including an element A and an element B. The element A may be one of molybdenum (Mo) and tungsten (W), and the element B may be one of vanadium (V), niobium (Nb), and tantalum (Ta). A content (x) of the element B may be greater than 0 and no more than 15 at % (0<x≤15 at %), based on a total content of the inorganic hole injection layer 321.

The inorganic hole injection layer 321 has a higher work function than that of the first electrode 310. According to some embodiments, the work function of the first electrode 310 may be about 4.0 eV to about 5.1 eV, and the work function of the inorganic hole injection layer 321 may be about 5.0 to about 5.8 eV. According to some embodiments, the first electrode 310 may be ITO/Ag/ITO or ITO/Ag, and the inorganic hole injection layer 321 may be Mo—Ta—O (where a content (x) of Ta is about 0<x≤15 at %), based on a total content of the inorganic hole injection layer 321.

A thickness of the inorganic hole injection layer 321 may be about 10 Å to about 50 Å. The inorganic hole injection layer 321 and the first electrode 310 may be wet-etched together by an etchant including at least one of phosphoric acid, nitric acid, and acetic acid. The surface roughness of the inorganic hole injection layer 321 may be about 0.3 nm to about 0.5 nm.

According to the present embodiment, the inorganic hole injection layer 321 may serve as the organic hole injection layer 323 of FIG. 4. Thus an organic hole injection layer may be omitted. For example, the inorganic hole injection layer 321 may have a high work function. Accordingly, the level of the work function may be formed to be near an HOMO level of the hole transport layer HTL, such that even if organic hole injection layers are absent, holes may be easily transmitted to the hole transport layer HTL. The organic hole injection layer may be omitted in order to provide a simplified manufacturing process.

Figure 7:
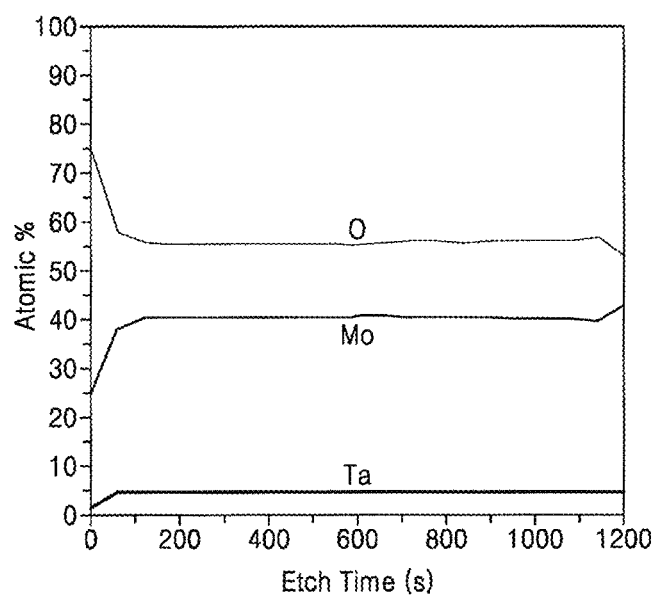
FIG. 7 illustrates data obtained by measuring a composition ratio of a formed molybdenum-tantalum-oxygen (MTO) single layer that may be included according to an embodiment.
Figure 8:
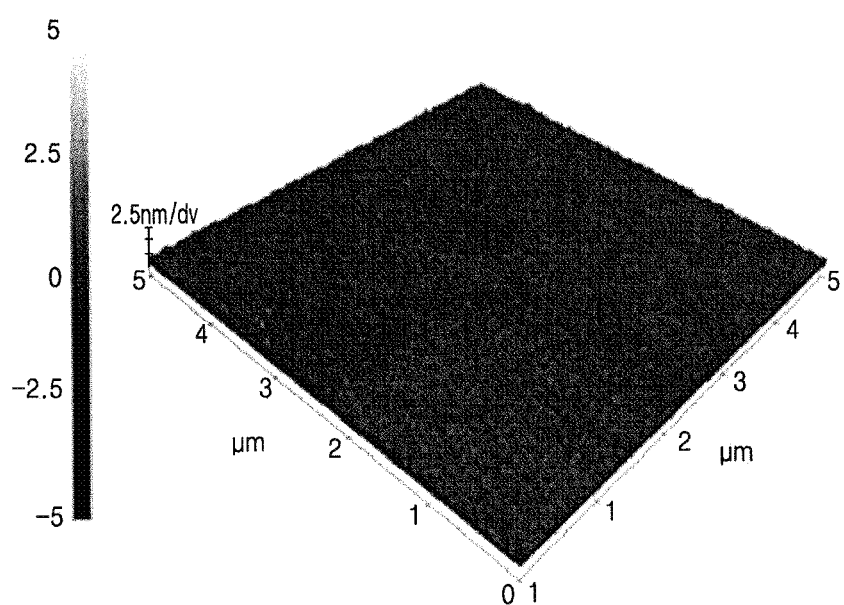
FIG. 8 illustrates an atomic force microscopy (AFM) image of the MTO single layer that may be included according to an embodiment.
Figure 9:
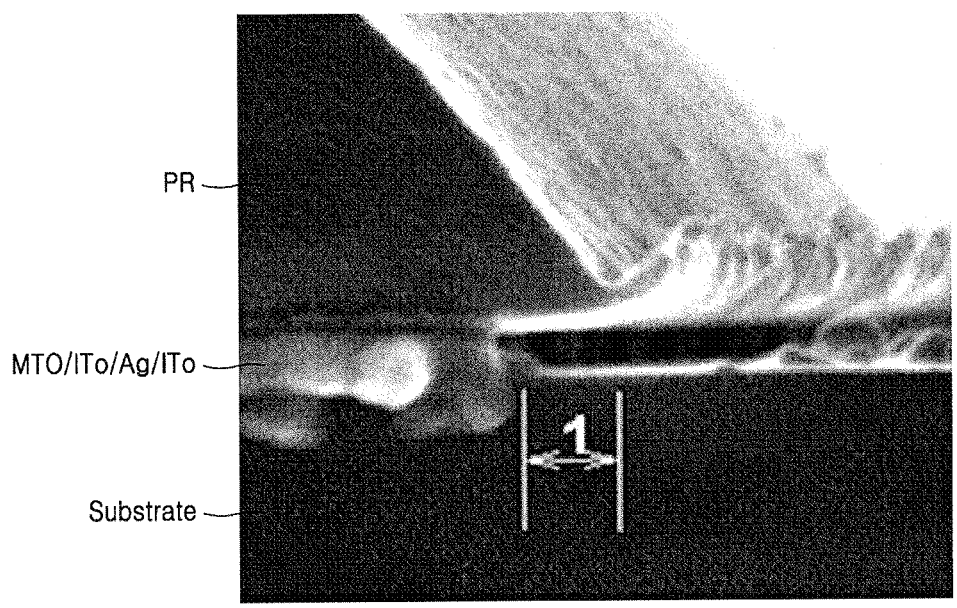
FIG. 9 illustrates an image obtained by wet-etching MTO/ITO/Ag/ITO.

FIGS. 7 through 9 illustrate data for evaluating an inorganic hole injection layer according to the present disclosure. In FIGS. 7 through 9, the inorganic hole injection layer was formed of Mo—Ta—O (MTO), and a content of Ta was about 5 at %.

FIG. 7 illustrates data obtained by measuring a composition ratio of a formed MTO single layer, and FIG. 8 illustrates an image obtained by measuring a surface roughness of the MTO single layer via atomic force microscopy (AFM). Referring to FIGS. 7 and 8, in the composition ratio of the MTO single layer, Mo was 40.37 at %, oxygen (O) was 55.36 at %, and Ta was 4.27 at %. A surface roughness (RMS) of the MTO single layer was 0.37 nm, indicating that the MTO single layer has surface flatness that enables an organic material layer to be evenly formed on the MTO single layer. It was confirmed that the MTO single layer has an amorphous structure.

The work function of the formed MTO single layer was measured to be about 5.4 to about 5.6 eV. This measured value represents a work function value that is higher than that of a material usable to form an anode electrode, such as 4.9 to 5.1 eV, which is a work function of ITO, and 4.2 to 4.7 eV, which is a work function of Ag, indicating that the MTO single layer may function as an inorganic hole injection layer.

FIG. 9 illustrates characteristics of wet-etching conducted after MTO is formed on ITO/Ag/ITO usable to form a first electrode. MTO/ITO/Ag/ITO were formed to have thicknesses of 50 Å/70 Å/850 Å/50 Å, respectively.

To evaluate wet etching characteristics, MTO/ITO/Ag/ITO were formed on a substrate such that MTO was formed at the top, and photoresist (PR) was formed on the MTO/ITO/Ag/ITO. Next, wet etching was conducted using an etchant including phosphoric acid, nitric acid, and/or acetic acid. Referring to FIG. 9, MTO/ITO/Ag/ITO were wet-etched together. Accordingly, it may be confirmed that the inorganic hole injection layer 321 and the first electrode 310 may be simultaneously etched and thus simplification of a manufacturing process may be promoted.

By way of summation and review, embodiments provide an organic light-emitting diode that is favorable in terms of a manufacturing process and that has increased luminescence efficiency, and an organic light-emitting display device including the organic light-emitting diode.

As described above, OLEDs according to embodiments include an inorganic hole injection layer, and luminescence efficiency may be improved. Moreover, because the inorganic hole injection layer may be patterned together with a first electrode formed therebelow, the OLEDs and organic light-emitting display devices including the OLEDs may be manufactured according to a simple process.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. An organic light-emitting diode, comprising:
   a first electrode and a second electrode that face each other;
   an organic emission layer between the first electrode and the second electrode; and
   an inorganic hole injection layer between the first electrode and the organic emission layer,
   wherein:
   the inorganic hole injection layer includes an oxide of a form A-B-O, including an element A and an element B,
   the element A is one of molybdenum (Mo) and tungsten (W),
   the element B is one of vanadium (V), niobium (Nb), and tantalum (Ta),
   an atom content (x) of the element B is greater than 0 and no more than 15 at % based on a total atom content of the inorganic hole injection layer, and
   a surface roughness of the inorganic hole injection layer is in a range of about 0.3 nm to about 0.5 nm.

2. The organic light-emitting diode as claimed in claim 1, wherein a work function of the inorganic hole injection layer is greater than a work function of the first electrode.

3. The organic light-emitting diode as claimed in claim 1, wherein the work function of the inorganic hole injection layer is in a range of about 5.0 eV to about 5.8 eV.

4. The organic light-emitting diode as claimed in claim 1, wherein a thickness of the inorganic hole injection layer is in a range of about 10 Å to about 50 Å.

5. The organic light-emitting diode as claimed in claim 1, wherein the inorganic hole injection layer and the first electrode have a structure obtained by wet-etching the inorganic hole injection layer and the first electrode together by an etchant including at least one of phosphoric acid, nitric acid, and acetic acid.

6. The organic light-emitting diode as claimed in claim 1, further comprising an organic hole injection layer between the inorganic hole injection layer and the organic emission layer,
   wherein a Fermi level that determines a work function of the inorganic hole injection layer is higher than a highest occupied molecular orbital (HOMO) level of the organic hole injection layer.

7. The organic light-emitting diode as claimed in claim 1, further comprising an electron transport layer and an electron injection layer stacked between the organic emission layer and the second electrode.

8. The organic light-emitting diode as claimed in claim 1, further comprising a hole transport layer between the inorganic hole injection layer and the organic emission layer.

9. The organic light-emitting diode as claimed in claim 1, wherein
   the first electrode includes indium tin oxide (ITO)/silver/ITO, and
   the inorganic hole injection layer includes molybdenum-tantalum-oxygen (Mo—Ta—O).

10. An organic light-emitting diode, comprising:
    a first electrode and a second electrode that face each other;
    an organic emission layer between the first electrode and the second electrode; and
    an inorganic hole injection layer between the first electrode and the organic emission layer,
    wherein:
    the inorganic hole injection layer includes an oxide of a form A-B-O including an element A and an element B,
    the element A is one of molybdenum (Mo) and tungsten (W),
    the element B is one of vanadium (V), niobium (Nb), and tantalum (Ta),
    a work function of the inorganic hole injection layer is greater than a work function of the first electrode, and
    a surface roughness of the inorganic hole injection layer is in a range of about 0.3 nm to about 0.5 nm.

11. The organic light-emitting diode as claimed in claim 10, wherein:
    the work function of the first electrode is about 4.0 eV to about 5.1 eV, and the work function of the inorganic hole injection layer is about 5.0 eV to about 5.8 eV.

12. The organic light-emitting diode as claimed in claim 10, wherein:
the first electrode includes indium tin oxide (ITO)/silver/ITO, and
the inorganic hole injection layer includes molybdenum-tantalum-oxygen (Mo—Ta—O), and an atom content (x) of Ta is greater than 0 and no more than 15 at %, based on a total atom content of the inorganic hole injection layer.

13. The organic light-emitting diode as claimed in claim 10, wherein a thickness of the inorganic hole injection layer is in a range of about 10 Å to about 50 Å.

14. An organic light-emitting display device comprising a plurality of pixels, each pixel including an organic light-emitting diode and at least one thin film transistor, the organic light-emitting diode including:
a first electrode and a second electrode that face each other;
an organic emission layer between the first electrode and the second electrode; and
an inorganic hole injection layer between the first electrode and the organic emission layer,
wherein the inorganic hole injection layer includes an oxide of a form A-B-O including an element A and an element B,
the element A is one of molybdenum (Mo) and tungsten (W), and the element B is one of vanadium (V), niobium (Nb), and tantalum (Ta),
an atom content (x) of the element B is greater than 0 and no more than 15 at %, based on a total atom content of the inorganic hole injection layer, and
a surface roughness of the inorganic hole injection layer is in a range of about 0.3 nm to about 0.5 nm.

15. The organic light-emitting display device as claimed in claim 14, wherein a work function of the inorganic hole injection layer is greater than a work function of the first electrode.

16. The organic light-emitting display device as claimed in claim 14, wherein the work function of the inorganic hole injection layer is in a range of about 5.0 eV to about 5.8 eV.

17. The organic light-emitting display device as claimed in claim 14, wherein a thickness of the inorganic hole injection layer is in a range of about 10 Å to about 50 Å.

18. The organic light-emitting display device as claimed in claim 14, wherein the inorganic hole injection layer and the first electrode have a structure characteristic obtained by wet-etching the inorganic hole injection layer and the first electrode together by an etchant including at least one of phosphoric acid, nitric acid, and acetic acid.

19. The organic light-emitting display device as claimed in claim 14, wherein
the first electrode includes indium tin oxide (ITO)/silver/ITO, and
the inorganic hole injection layer includes molybdenum-tantalum-oxygen (Mo—Ta—O), and an atom content (x) of Ta is greater than 0 and no more than 15 at %, based on a total atom content of the inorganic hole injection layer.

* * * * *